United States Patent
Jo et al.

(10) Patent No.: US 11,322,575 B2
(45) Date of Patent: May 3, 2022

(54) DISPLAY DEVICE FOR SELECTIVELY SUPPLYING DATA SIGNAL TO DRIVING AREA DURING DIVISIONAL DRIVING

(71) Applicant: LG Display Co., Ltd., Seoul (KR)

(72) Inventors: JeongOk Jo, Seoul (KR); MinJic Lee, Paju-si (KR); HongSik Kim, Goyang-si (KR); Yeseul Han, Gimpo-si (KR); Kwanghyun Choi, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/345,347

(22) Filed: Jun. 11, 2021

(65) Prior Publication Data
US 2022/0077275 A1  Mar. 10, 2022

(30) Foreign Application Priority Data

Sep. 4, 2020  (KR) ........................ 10-2020-0113041

(51) Int. Cl.
*G09G 3/30* (2006.01)
*H01L 27/32* (2006.01)
(Continued)

(52) U.S. Cl.
CPC ......... *H01L 27/3279* (2013.01); *G09G 3/035* (2020.08); *G09G 3/3225* (2013.01);
(Continued)

(58) Field of Classification Search
CPC ........ H01L 27/3279; H01L 2251/5338; G09G 3/035; G09G 3/3225; G09G 3/3275;
(Continued)

(56) References Cited

U.S. PATENT DOCUMENTS

2009/0284500 A1* 11/2009 Yamashita ........... G09G 3/3666
345/204
2015/0109357 A1* 4/2015 Nakai ...................... G09G 3/36
345/691
(Continued)

FOREIGN PATENT DOCUMENTS

KR 10-2015-0115618 A 10/2015
KR 10-2018-0039797 A 4/2018

OTHER PUBLICATIONS

Partial European Search Report dated Dec. 7, 2021 issued in corresponding Patent Application No. 21179219.7 (18 pages).

*Primary Examiner* — Pegeman Karimi
(74) *Attorney, Agent, or Firm* — Polsinelli PC

(57) ABSTRACT

A display device includes a substrate including a display area having a first display area and a second display area, and a non-display area extending from the display area; a plurality of first sub-data lines disposed in the first display area; a plurality of second sub-data lines disposed in the second display area to correspond to the plurality of first sub-data lines; a control line including a line portion extending in a direction different from a direction in which the plurality of first sub-data lines and the plurality of second sub-data lines extend; and a plurality of transistors disposed between the plurality of first sub-data lines and the plurality of second sub-data lines and controlled by the control line to connect or disconnect the plurality of first sub-data lines and the plurality of second sub-data lines, thereby reducing power consumption by supplying a data signal only to a driving area during divisional driving.

23 Claims, 8 Drawing Sheets

(51) Int. Cl.
*G09G 3/3275* (2016.01)
*G09G 3/3225* (2016.01)
*G09G 3/00* (2006.01)

(52) U.S. Cl.
CPC ..... *G09G 3/3275* (2013.01); *G09G 2330/021* (2013.01); *H01L 2251/5338* (2013.01)

(58) Field of Classification Search
CPC ...... G09G 2330/021; G09G 3/30; G09G 3/32; G09G 3/34; G09G 3/36
See application file for complete search history.

(56) References Cited

U.S. PATENT DOCUMENTS

| | | | |
|---|---|---|---|
| 2015/0243208 A1* | 8/2015 | Kim | G09G 3/3225 345/204 |
| 2016/0335975 A1 | 11/2016 | Liu | |
| 2018/0088654 A1 | 3/2018 | Liu | |
| 2019/0305081 A1* | 10/2019 | LaJoie | H01L 27/124 |
| 2020/0312253 A1* | 10/2020 | Kim | G09G 3/035 |
| 2021/0027703 A1* | 1/2021 | Lin | G09G 3/325 |

* cited by examiner

DISPLAY DEVICE FOR SELECTIVELY SUPPLYING DATA SIGNAL TO DRIVING AREA DURING DIVISIONAL DRIVING

CROSS-REFERENCE TO RELATED APPLICATION

This application claims the benefit of and priority to Korean Patent Application No. 10-2020-0113041 filed on Sep. 4, 2020, which is hereby incorporated by reference in its entirety.

BACKGROUND

Field of the Disclosure

The present disclosure relates to a display device and more particularly, to a display device capable of reducing power consumption by supplying a data signal only to an area in which driving is performed during divisional driving depending on whether or not it is folded.

Description of the Background

Recently, as our society advances toward an information-oriented society, the field of display device for visually expressing an electrical information signal has rapidly advanced. Various display devices having excellent performance in terms of thinness, lightness, and low power consumption, are being developed correspondingly.

Specifically, flat panel display devices such as a liquid crystal display device using an LED (Light Emitting Diode) as a light source and an organic light emitting diode display device using a self-luminous OLED as a light source have received considerable attention as next generation display devices due to a small thickness and low power consumption thereof. In particular, in recent years, flexible display devices such as bendable display devices or foldable display devices have been developed.

The flexible display device may be implemented by configuring a substrate of a plastic material. Since the flexible display device can be easily carried when folded and can realize a large screen when unfolded, it can be applied to various application fields such as televisions and monitors as well as mobile equipment such as mobile phones, e-books, and electronic newspapers.

SUMMARY

Accordingly, the present disclosure is to provide a display device capable of performing full driving or divisional driving depending on whether or not it is folded.

Also, the present disclosure is to provide a display device capable of reducing power consumption by supplying a data signal only to a driving area during divisional driving.

The present disclosure is not limited to the above-mentioned features, which are not mentioned above, can be clearly understood by those skilled in the art from the following descriptions.

According to an aspect of the present disclosure, a display device includes a substrate including a display area having a first display area and a second display area, and a non-display area extending from the display area; a plurality of first sub-data lines disposed in the first display area; a plurality of second sub-data lines disposed in the second display area to correspond to the plurality of first sub-data lines; a control line including a line portion extending in a direction different from a direction in which the plurality of first sub-data lines and the plurality of second sub-data lines extend; and a plurality of transistors disposed between the plurality of first sub-data lines and the plurality of second sub-data lines and controlled by the control line to connect or disconnect the plurality of first sub-data lines and the plurality of second sub-data lines.

According to another aspect of the present disclosure, a display device includes a substrate including a display area divided into a constant driving area and a selective driving area by a virtual folding line in which folding is performed; a control line including a line portion extending in parallel with the folding line; a plurality of data lines extending in a direction that crosses the folding line and separated between the constant driving area and the selective driving area; and a plurality of transistors disposed between the plurality of separated data lines and turned on or off by the control line. When the plurality of transistors are turned on, the plurality of separated data lines are electrically connected so that the selective driving area is switched to a driving state. When the plurality of transistors are turned off, the plurality of separated data lines are electrically insulated so that the selective driving area is switched to a non-driving state.

Other detailed matters of the exemplary aspects are included in the detailed description and the drawings.

According to the present disclosure, data lines are separated in a constant driving area and a selective driving area, and a transistor is disposed between the separated data lines and can control supply of a data signal.

According to the present disclosure, the transistor is turned on or off depending on whether or not folding is performed, so that a data signal is blocked in the selective driving area during divisional driving, thereby allowing for a reduction in power consumption.

The effects according to the present disclosure are not limited to the contents exemplified above, and more various effects are included in the present specification.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain the principle of the disclosure.

In the drawings.

DETAILED DESCRIPTION

Figure 1A:
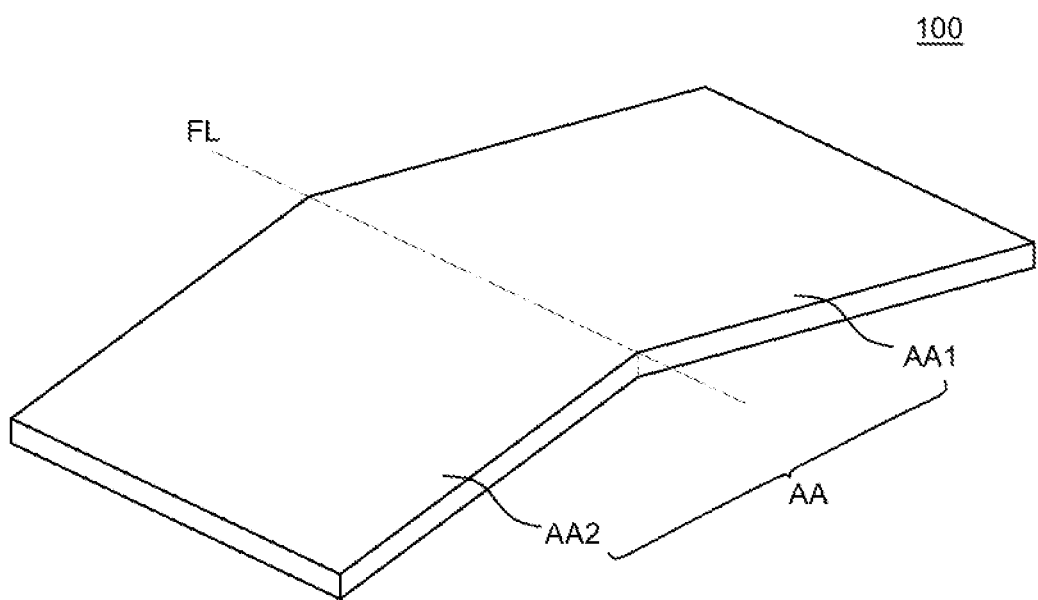
FIG. 1A is a perspective view of a display device according to an exemplary aspect of the present disclosure.

Advantages and characteristics of the present disclosure and a method of achieving the advantages and characteristics will be clear by referring to exemplary aspects described below in detail together with the accompanying drawings. However, the present disclosure is not limited to the exemplary aspects disclosed herein but will be implemented in various forms. The exemplary aspects are provided by way of example only so that those skilled in the art can fully understand the disclosures of the present disclosure and the scope of the present disclosure. Therefore, the present disclosure will be defined only by the scope of the appended claims.

The shapes, sizes, ratios, angles, numbers, and the like illustrated in the accompanying drawings for describing the exemplary aspects of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "consist of" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various aspects of the present disclosure can be partially or entirely adhered to or combined with each other and can be interlocked and operated in technically various ways, and the aspects can be carried out independently of or in association with each other.

Hereinafter, the present disclosure will be described in detail with reference to accompanying drawings.

Figure 1B:
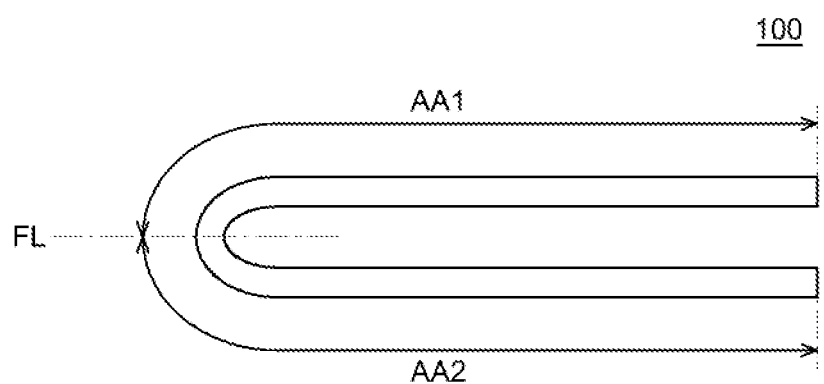
FIG. 1B is a cross-sectional view illustrating a folding structure of the display device according to an exemplary aspect of the present disclosure.

FIG. 1A is a perspective view of a display device according to an exemplary aspect of the present disclosure. FIG. 1B is a cross-sectional view illustrating a folding structure of the display device according to an exemplary aspect of the present disclosure.

Referring to FIG. 1A and FIG. 1B, a display device 100 according to an aspect of the present disclosure may be a foldable display device. Accordingly, the display device 100 may be folded or unfolded along a folding line FL. FIG. 1A illustrates a state in which the display device 100 is folded at a certain angle, and FIG. 1B illustrates a state in which the display device 100 is completely folded. FIG. 1A and FIG. 1B illustrate that the folding line FL is disposed in a center of the display device 100, but is not limited thereto.

A display area AA where an image is displayed in the display device 100 may be divided into a first display area AA1 and a second display area AA2 by the folding line FL. In this case, the display device 100 may be divisionally driven depending on whether or not it is folded. Specifically, the first display area AA1 may be a constant driving area that is driven all the time when the display device 100 is driven. That is, the first display area AA1 may be driven all the time when the display device 100 displays an image regardless of whether or not the display device 100 is folded. The second display area AA2 may be a selective driving area that is driven when the display device 100 is unfolded and is not driven when the display device 100 is folded.

The display device 100 may be implemented in an out-folding method or an in-folding method according to a position of the display area AA when folded. Specifically, in the case of an out-folding display device, the display area AA may be disposed outside when the display device is folded. In addition, in the case of an in-folding display device, the display area AA is disposed inside when the display device is folded and thus, when the display device 100 is completely in-folded, the display area AA may not be visually recognized by a user. Hereinafter, a description will be made on the assumption that the display device 100 according to an exemplary aspect is in an out-folding method, but the present disclosure is not limited thereto.

Meanwhile, in FIG. 1B, for convenience of illustration, a curved area having a certain curvature based on the folding line FL is shown to be relatively large, but a size of the curved area may be very small.

Hereinafter, the display device 100 according to an exemplary aspect of the present disclosure will be described in detail with reference to FIG. 2.

Figure 2:
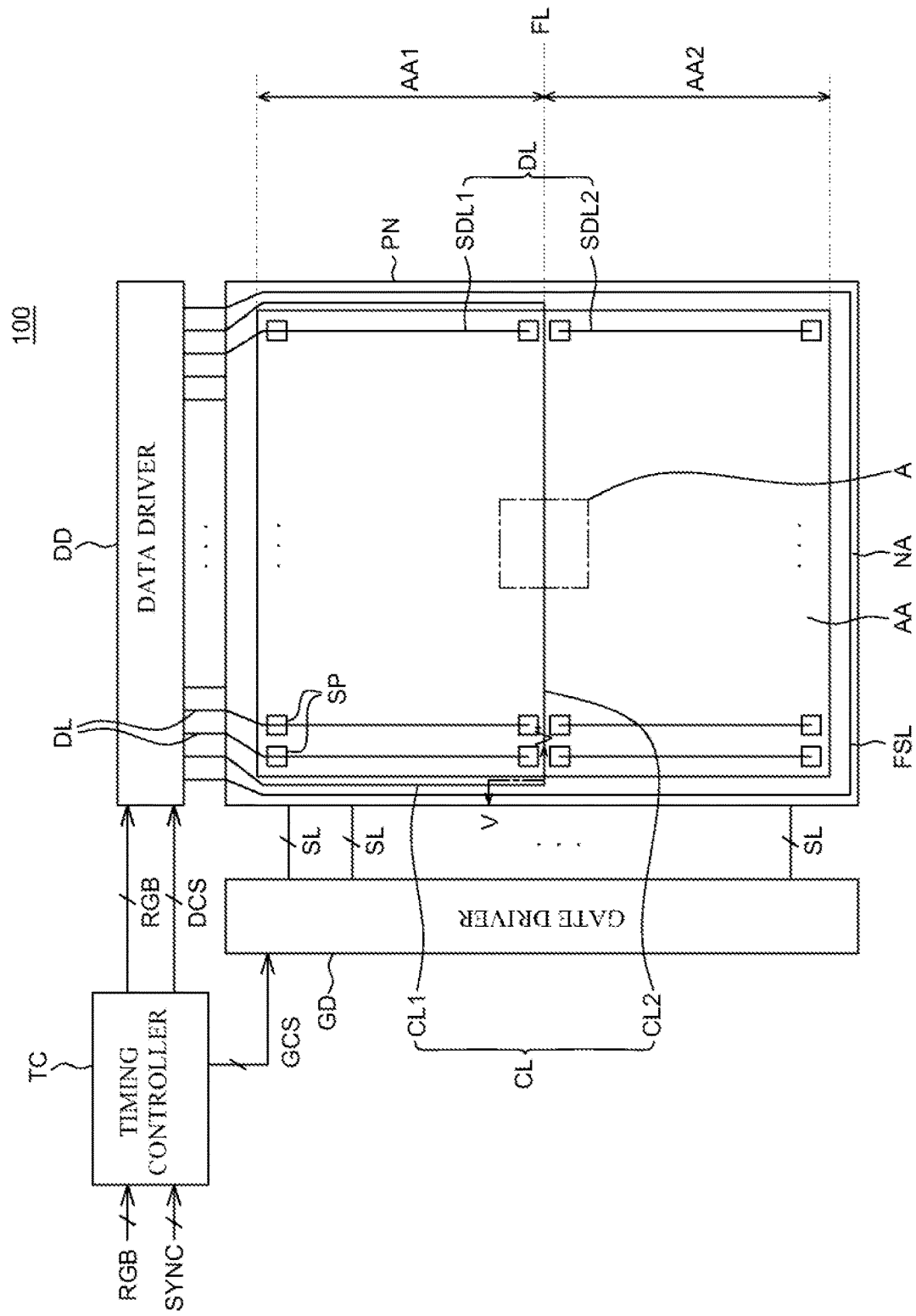
FIG. 2 is a schematic configuration diagram of the display device according to an exemplary aspect of the present disclosure.

FIG. 2 is a schematic configuration diagram of the display device according to an exemplary aspect of the present disclosure. In FIG. 2, only a display panel PN, a gate driver GD, a data driver DD, and a timing controller TC among various components of the display device 100 are illustrated for convenience of description.

Referring to FIG. 2, the display device 100 includes a display panel PN that includes a plurality of sub-pixels SP, a gate driver GD and a data driver DD that supply various signals to the display panel PN, and a timing controller TC that controls the gate driver GD and the data driver DD.

The gate driver GD supplies a plurality of scan signals to a plurality of scan lines SL according to a plurality of gate control signals GCS provided from the timing controller TC. In this case, the plurality of scan lines SL may extend in a first direction. In FIG. 2, for convenience of description, one gate driver GD is disposed to be spaced apart from the display panel PN, but the number and arrangement of the gate drivers GD are not limited thereto. For example, the gate driver GD may be disposed within the panel PN in a GIP (gate in panel) method. In addition, in FIG. 2, the gate driver GD is shown to be disposed on a left side of the display panel PN, but the gate driver GD may be disposed on a right side of the display panel PN and may be disposed both on the left side and on the right side of the display panel PN. In addition, when the gate driver GD is disposed in the GIP method, the gate driver GD may be disposed outside a folding detection line FSL or between the folding detection line FSL and a control line CL or inside the control line CL, but is not limited thereto.

The data driver DD converts image data RGB input from the timing controller TC into a data signal using a reference gamma voltage according to a plurality of data control signals DCS provided from the timing controller TC. In addition, the data driver DD may supply the converted data signal to a plurality of data lines DL. In this case, the plurality of data lines DL may extend in a second direction perpendicular to the first direction.

The timing controller TC aligns image data RGB input from the outside and supplies it to the data driver DD. The timing controller TC may generate the gate control signal GCS and the data control signal DCS using a synchronization signal SYNC input from the outside, for example, a dot clock signal, a data enable signal, and a horizontal/vertical synchronization signal. In addition, the timing controller TC may supply the generated gate control signal GCS and data control signal DCS to the gate driver GD and the data driver DD, respectively, to thereby control the gate driver GD and the data driver DD.

The display panel PN, a component for displaying an image to a user, includes the display area AA and a non-display area NA.

The display area AA is an area where an image is displayed. The display area AA includes the plurality of sub-pixels SP. In the display panel PN, the plurality of scan lines SL and the plurality of data lines DL cross each other, and each of the plurality of sub-pixels SP is connected to the scan line SL and the data line DL. In addition, although not shown in the drawings, each of the plurality of sub-pixels SP may be connected to high potential power lines PL, a low potential power line, initialization signal lines IL, emission control signal lines EL, and the like.

The plurality of sub-pixels SP are a minimum unit constituting a screen, and each of the plurality of sub-pixels SP includes a light emitting element and a pixel circuit for driving the light emitting element. A plurality of light emitting elements may be differently defined according to a type of the display panel PN. For example, when the display panel PN is an organic light emitting display panel, the light emitting element is an organic light emitting element including an anode, an organic layer, and a cathode. In addition, a quantum dot light emitting diode (QLED) including a quantum dot (QD), or the like may be used as the light emitting element. Hereinafter, a description will be made on the assumption that the light emitting element is an organic light emitting element, but a type of the light emitting element is not limited thereto.

The pixel circuit is a circuit for controlling driving of the light emitting element. The pixel circuit may be configured to include a plurality of transistors, a capacitor, lines and the like. For example, the pixel circuit may include six transistors and a single capacitor, but is not limited thereto.

The display area AA includes the first display area AA1 and the second display area AA2. The first display area AA1 and the second display area AA2 may be areas that are respectively disposed on one side and the other side of the display area AA based on the folding line FL. In this case, the folding line FL may extend in the first direction. The first display area AA1 may be an area that is disposed closer to the data driver DD than the second display area AA2. An area that is adjacent to the data driver DD among the first and second display areas AA1 and AA2 may be a constant driving area. Also, an area that is disposed relatively far from the data driver DD among the first display area AA1 and the second display area AA2 may be a selective driving area. That is, the first display area AA1 that may directly receive a data signal from the data driver DD is driven all the time, and the second display area AA2 that receives the data signal through the first display area AA1 is selectively driven by the control line CL, a divisional driving of the display device 100 may be performed.

Specifically, the plurality of data lines DL are connected to each of columns of the plurality of sub-pixels SP that are disposed in the second direction. In this case, the plurality of data lines DL may be separated in the first display area AA1 and the second display area AA2. That is, the plurality of data lines DL may include first sub-data lines SDL1 that are disposed in the first display area AA1 and second sub-data lines SDL2 that are disposed in the second display area AA2. Accordingly, sub-pixels SP that are disposed in the first display area AA1 among the plurality of sub-pixels SP disposed in the same column are connected to the first sub-data lines SDL1, and sub-pixels SP that are disposed in the second display area AA2 among the plurality of sub-pixels SP disposed in the same column may be connected to the second sub-data lines SDL2.

A first transistor T1 to be described later in FIGS. 3 and 4 may be disposed between the first sub-data line SDL1 and the second sub-data line SDL2. That is, one data line DL may include the first sub-data line SDL1, the second sub-data line SDL2, and the first transistor T1. When the first transistor T1 is turned on, the first sub-data line SDL1 and the second sub-data line SDL2 may be electrically connected to each other. When the first transistor T1 is turned off, the first sub-data line SDL1 and the second sub-data line SDL2 may be electrically insulated from each other.

When the display panel PN is in an unfolded state, the plurality of sub-pixels SP of the display area AA may be entirely driven to display an image. Specifically, the data signal supplied through the data driver DD may be transmitted to both the first sub-data line SDL1 disposed in the first display area AA1 and the second sub-data line disposed in the second display area AA2. That is, the first transistor T1 between the first sub-data line SDL1 and the second sub-data line SDL2 may be in a turned-on state. Accordingly, all of the first display area AA1 and the second display area AA2 may display an image.

On the other hand, when the display panel PN is folded, the display area AA may be divisionally driven. That is, when the display panel PN is folded, the first display area AA1 positioned on one side with respect to the folding line FL may be driven, and the second display area AA2 positioned on the other side with respect to the folding line FL may not be driven. Specifically, when the display panel PN is folded, the data signal supplied through the data driver DD is transmitted only to the first sub-data line SDL1 disposed in the first display area AA1, and is not transmitted to the second sub-data line SDL2 disposed in the second display area AA2. That is, the first transistor T1 between the first sub-data line SDL1 and the second sub-data line SDL2 may be turned off. Accordingly, when the display panel PN is folded, the first display area AA may display an image, and the second display area AA may not display an image. When the display panel PN is folded, since the data signal is supplied only to the first display area AA where an image is displayed, power consumption can be reduced.

The non-display area NA, an area where an image is not displayed, may extend from the display area AA. The non-display area NA is an area where various lines, driver ICs and the like for driving the plurality of sub-pixels SP disposed in the display area AA are disposed. In FIG. 2, the gate driver GD and the data driver DD are shown to be spaced apart from sides of the display panel PN, but various driving ICs such as the gate driver GD and the data driver DD may be disposed in the non-display area NA of the display panel PN.

The folding detection line FSL is disposed in an outer portion of the non-display area NA to surround the display area AA. The folding detection line FSL may be connected to a folding detection sensor to thereby detect folding of the display panel PN. The folding detection line FSL may be implemented as strain gauge. Specifically, the folding detection line FSL may be formed of a metal or semiconductor whose resistance varies greatly depending on a magnitude of force. Therefore, when the display panel PN is folded or unfolded, the resistance of the folding detection line FSL is changed, and the folding detection sensor may detect a change in the resistance of the folding detection line FSL and determine whether or not folding is performed. The folding detection line FSL extends from the data driver DD, and the folding detection sensor may be included in the data driver DD, but is not limited thereto.

The control line CL is disposed along a perimeter of the first display area AA1. The control line CL may be disposed inside the folding detection line FSL, but is not limited thereto. The control line CL includes connection portions CL1 and a line portion CL2. The connection portions CL1 may extend from the data driver DD in the second direction and may be disposed one by one in the non-display area NA that is located on one side and the other side of the first display area AA1. The line portion CL2 connects a pair of the connection portions CL1. The line portion CL2 extends in the first direction and may be disposed to cross the display area AA. The line portion CL2 may overlap the folding line FL between the first display area AA1 and the second display area AA2, but is not limited thereto. A part of the line portion CL2 may function as a gate electrode of the first transistor T1. Accordingly, the data driver DD may turn on or off the first transistor T1 by supplying a control signal to the control line CL depending on whether or not folding is detected.

Specifically, when the display device 100 is folded, the resistance of the folding detection line FSL may be changed. When a change in the resistance of the folding detection line FSL is greater than or equal to a preset range, the folding detection sensor may detect the folding of the display device 100. When the folding is detected, the folding detection sensor may output a folding detection signal. In addition, the data driver DD may output a control signal for turning off the first transistor T1 to the control line CL by the folding detection signal. The first transistor T1 is turned off by the control signal, and the first sub-data line SDL1 and the second sub-data line SDL2 may be electrically insulated from each other. Accordingly, the data signal output from the data driver DD is supplied only to the first display area AA1 and is not supplied to the second display area AA2. Thus, when the display device 100 is folded, the first display area AA1 may be driven to display an image, and the second display area AA2 may not be driven.

Conversely, when a change in the resistance of the folding detection line FSL is within a preset range, the folding detection sensor determines that the display device 100 is in an unfolded state. In the unfolding state, the folding detection sensor does not output a folding detection signal. Accordingly, the data driver DD may output a control signal for turning on the first transistor T1 to the control line CL. The first transistor T1 is turned on by the control signal, and the first sub-data line SDL1 and the second sub-data line SDL2 may be electrically connected to each other. Accordingly, the data signal output from the data driver DD is supplied to both the first display area AA1 and the second display area AA2. Thus, when the display device 100 is in an unfolded state, the display area AA is fully driven so that an image may be displayed in both the first display area AA1 and the second display area AA2.

Meanwhile, a distance between the plurality of sub-pixels SP in the display area AA may be uniform overall. That is, even if the line portion CL2 is disposed to cross a part of the display area AA, it may not affect disposition of the plurality of sub-pixels SP. For example, a distance between two adjacent sub-pixels SP with the line portion CL2 therebetween may be similar to a distance between the line portion CL2 and two sub-pixels SP that are spaced apart from each other. In particular, the line portion CL2 may be disposed below light emitting elements 130 disposed in the plurality of sub-pixels SP. Accordingly, even if the line portion CL2 is disposed, it may not affect disposition of a plurality of the light emitting elements 130 that are adjacent to the line portion CL2. That is, since the line portion CL2 may be designed to be included in the display area AA, it is possible to prevent the line portion CL2 from being visually recognized as a boundary line.

Hereinafter, a detailed structure of the first display area AA1 and the second display area AA2 adjacent to the folding line FL will be described with reference to FIGS. 3 and 4.

Figure 3:
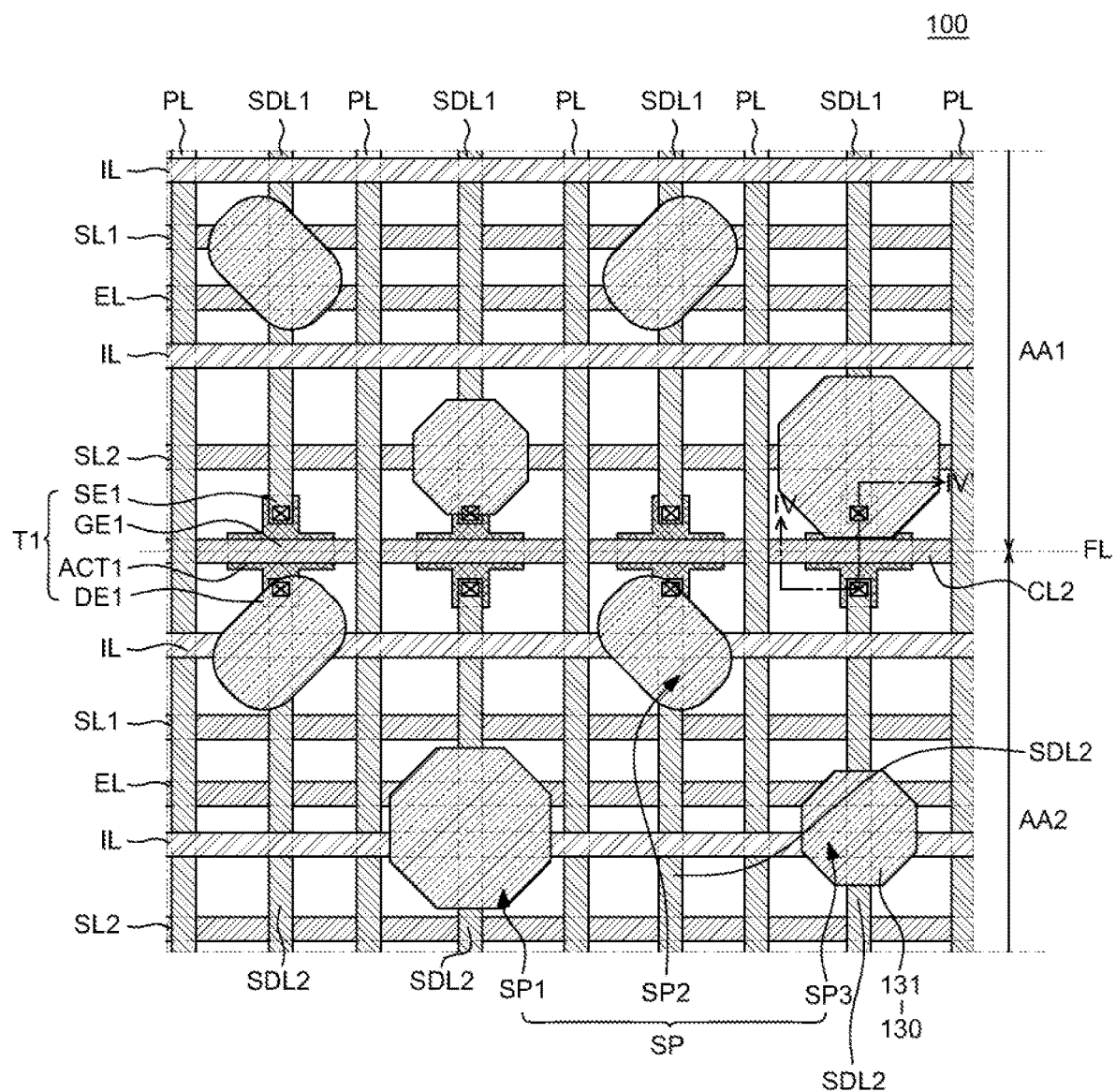
FIG. 3 is an enlarged plan view of region A of FIG. 2.

FIG. 3 is an enlarged plan view of region A of FIG. 2. FIG. 4 is a cross-sectional view taken along line IV-IV' of FIG. 3.

Figure 4:
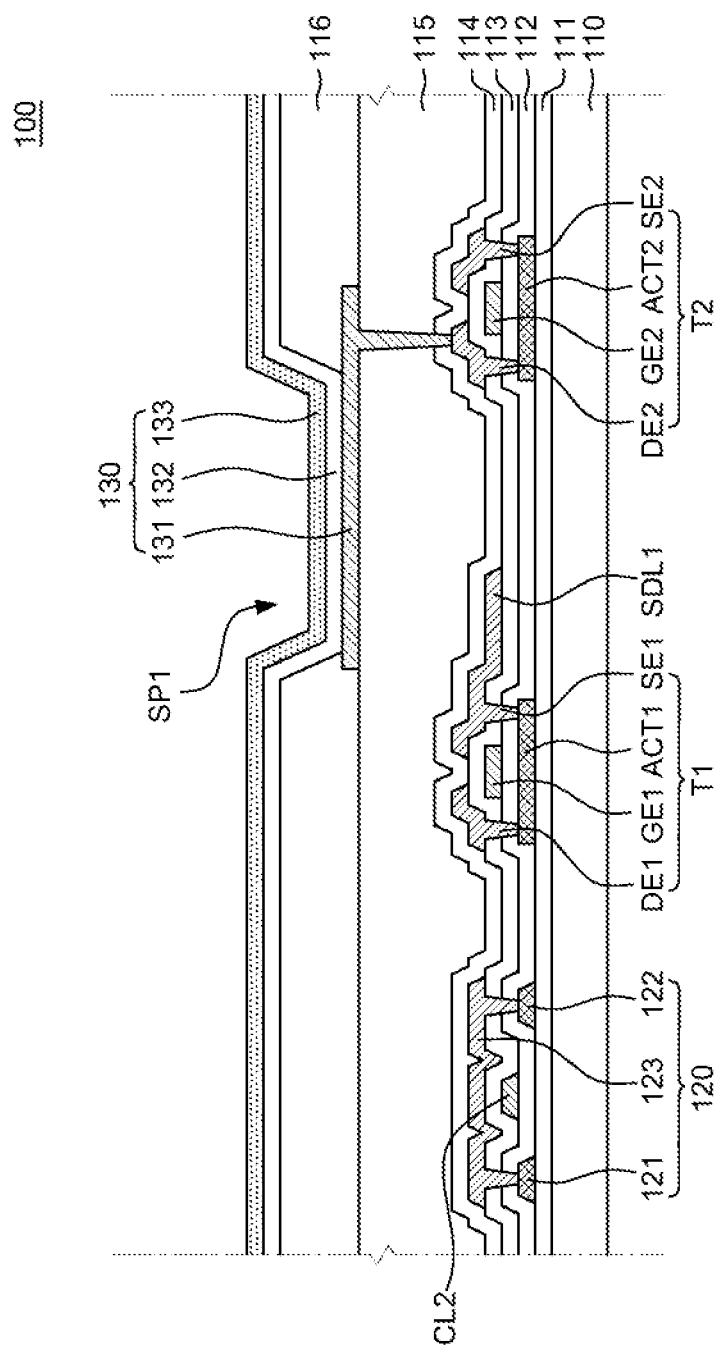
FIG. 4 is a cross-sectional view taken along line IV-IV' of FIG. 3.

Referring to FIGS. 3 and 4, the display device 100 according to an exemplary aspect of the present disclosure includes a substrate 110, a buffer layer 111, a gate insulating layer 112, an interlayer insulating layer 113, a passivation layer 114, a planarization layer 115, a bank 116, the high potential power lines PL, the data lines DL, the scan lines SL, the initialization signal lines IL, the emission control signal lines EL, the control line CL, the first transistor T1, a second transistor T2, and the light emitting elements 130. In FIG. 3, only the plurality of lines PL, DL, SL, IL, EL, and CL, the first transistor T1, and an anode 131 of the light emitting element 130 are illustrated for convenience of description.

Referring to FIG. 3, the plurality of sub-pixels SP are individual units that emit light, and the light emitting element 130 is disposed in each of the plurality of sub-pixels SP. The plurality of sub-pixels SP include first sub-pixels SP1, second sub-pixels SP2, and third sub-pixels SP3 that emit light of different colors. For example, the first sub-pixel SP1 may be a blue sub-pixel SP, the second sub-pixel SP2 may be a green sub-pixel SP, and the third sub-pixel SP3 may be a red sub-pixel SP. In this specification, although it has been described that the plurality of sub-pixels SP include the first sub-pixel SP1, the second sub-pixel SP2, and the third sub-pixel SP3, the number, arrangement and color combinations of the plurality of sub-pixels SP may be variously changed according to a design, but are not limited thereto.

A plurality of the first sub-pixels SP1 and a plurality of the third sub-pixels SP3 may be alternately disposed in the same column or in the same row. For example, the first sub-pixels SP1 and the third sub-pixels SP3 may be alternately disposed in the same column, and the first sub-pixels SP1 and the third sub-pixels SP3 may be alternately disposed in the same row.

A plurality of the second sub-pixels SP2 are disposed in different columns and different rows from those of the plurality of first sub-pixels SP1 and the plurality of third sub-pixels SP3. For example, the plurality of second sub-pixels SP2 are disposed in one row, and the plurality of first sub-pixels SP1 and the plurality of third sub-pixels SP3 may be alternately disposed in another row adjacent to the one row. In addition, the plurality of second sub-pixels SP2 may be disposed in one column, and the plurality of first sub-pixels SP1 and the plurality of third sub-pixels SP3 may be alternately disposed in another column adjacent to the one column. The plurality of first sub-pixels SP1 and the plurality of second sub-pixels SP2 may face each other in a diagonal direction, and the plurality of third sub-pixels SP3 and the plurality of second sub-pixels SP2 may also face each other in a diagonal direction. Accordingly, the plurality of sub-pixels SP may be disposed in a lattice shape.

However, in FIG. 3, it is illustrated that the plurality of first sub-pixels SP1 and the plurality of third sub-pixels SP3 are disposed in the same columns and the same rows, and the plurality of second sub-pixels SP2 are disposed in different columns and different rows from those of the plurality of first sub-pixels SP1 and the plurality of third sub-pixels SP3, but arrangement of the plurality of sub-pixels SP is not limited thereto.

A plurality of the high potential power lines PL extending in the second direction (or a column direction) are disposed between each of the plurality of sub-pixels SP. The plurality of high potential power lines PL are lines that transmit high potential power signals to each of the plurality of sub-pixels SP. The high potential power line PL may be disposed between a column in which the plurality of second sub-pixels SP2 are disposed and a column in which the plurality of first sub-pixels SP1 and the plurality of third sub-pixels SP3 are disposed. For example, the high potential power lines PL may be disposed on both sides of the plurality of second sub-pixels SP2 and may be disposed on both sides of the plurality of first sub-pixels SP1 and the plurality of third sub-pixels SP3.

The plurality of data lines DL extending in the second direction are disposed between each of the plurality of high potential power lines PL. The plurality of data lines DL are lines that transmit data signals to each of the plurality of sub-pixels SP. The plurality of high potential power lines PL and the plurality of data lines DL may be alternately disposed. Some of the plurality of data lines DL may be disposed to overlap the plurality of second sub-pixels SP2 disposed in the same column, and others of the plurality of data lines DL may be disposed to overlap the plurality of first sub-pixels SP1 and the plurality of third sub-pixels SP3 disposed in the same column.

The plurality of data lines DL includes a plurality of first sub-data lines SDL1 disposed in the first display area AA1 and a plurality of second sub-data lines SDL2 disposed in the second display area AA2. That is, each of the plurality of data lines DL may be separated and spaced apart from each other in the first display area AA1 and the second display area AA2. The plurality of first sub-data lines SDL1 may extend in the second direction and be connected to the plurality of sub pixels SP that are disposed in the same columns as the plurality of first sub-data lines SDL1, in the first display area AA1. The plurality of second sub-data lines SDL2 may extend in the second direction and be connected to the plurality of sub pixels SP that are disposed in the same columns as the plurality of second sub-data lines SDL2, in the second display area AA2. Also, among the plurality of first sub-data lines SDL1 and the plurality of second sub-data lines SDL2, the sub-data lines SDL1 and SDL2 that are disposed in the same column may correspond to each other. Specifically, the first sub-data line SDL1 and the second sub-data line SDL2 disposed in the same column may be connected to each other by the first transistor T1. In this case, an end of the first sub-data line SDL1 may function as a source electrode of the first transistor T1, and an end of the second sub-data line SDL2 may function as a drain electrode of the first transistor T1.

A plurality of the initialization signal lines IL extend in the first direction (or in a row direction). Some of the plurality of initialization signal lines IL may be disposed between each of the plurality of sub-pixels SP. For example, the plurality of initialization signal lines IL may be disposed between a row in which the plurality of second sub-pixels SP2 are disposed and a row in which the plurality of first sub-pixels SP1 and the plurality of third sub-pixels SP3 are disposed. Alternatively, some of the plurality of initialization signal lines IL may be disposed to overlap the plurality of sub-pixels SP. For example, some of the plurality of initialization signal lines IL may overlap the plurality of second sub-pixels SP2, and others of the plurality of initialization signal lines IL may overlap the plurality of first sub-pixels SP1 and the plurality of third sub-pixels SP3.

The plurality of scan lines SL extending in the first direction are disposed between each of the plurality of initialization signal lines IL. The plurality of scan lines SL are lines that transmit scan signals to each of the plurality of sub-pixels SP. The plurality of scan lines SL include a plurality of first scan lines SL1 and a plurality of second scan lines SL2. Some of the plurality of first scan lines SL1 may overlap the plurality of second sub-pixels SP2. Alternatively, some of the plurality of first scan lines SL1 may be disposed between a row in which the plurality of second sub-pixels SP2 are disposed and a row in which the plurality of first sub-pixels SP1 and the plurality of third sub-pixels SP3 are disposed. some of the plurality of second scan lines SL2 may overlap the plurality of first sub-pixels SP1 and the plurality of third sub-pixels SP3. Alternatively, some of the plurality of first scan lines SL1 may be disposed between a row in which the plurality of first sub-pixels SP1 and the plurality of third sub-pixels SP3 are disposed, and a row in which the plurality of second sub-pixels SP2 are disposed.

A plurality of the emission control signal lines EL extending in the first direction in the same manner as the plurality of initialization signal lines IL and the plurality of scan lines SL are disposed. The plurality of emission control signal lines EL are lines that transmit emission control signals to each of the plurality of sub-pixels SP. The plurality of emission control signal lines EL may be disposed adjacent to the plurality of first scan lines SL1 or the plurality of initialization signal lines IL. Some of the plurality of emission control signal lines EL may overlap the plurality of second sub-pixels SP2. Alternatively, some of the plurality of emission control signal lines EL may overlap the plurality of first sub-pixels SP1 and the plurality of third sub-pixels SP3.

In this specification, it is illustrated that some of the plurality of lines are disposed between the plurality of sub-pixels SP, and others of the plurality of lines overlap the plurality of sub-pixels SP, but arrangement of the plurality of lines is not limited thereto. In addition, the number and arrangement order of the plurality of lines described in this specification may be variously changed according to a design.

The line portion CL2 of the control line CL is disposed at a boundary between the first display area AA1 and the second display area AA2. The control line CL is a line that transmits a control signal for turning on or off a plurality of first transistors T1. The connection portion CL1 of the control line CL is disposed in the non-display area and may supply the control signal output from the data driver DD to the line portion CL2. The line portion CL2 may extend in the first direction in the display area in the same manner as the plurality of initialization signal lines IL, the plurality of scan lines SL, and the plurality of emission control signal lines EL. The line portion CL2 may overlap the folding line FL, but is not limited thereto, and the line portion CL2 may be disposed in the first display area AA1 or the second display area AA2 that is adjacent to the folding line FL. That is, as long as a gate electrode that is a part of the line portion CL2 or connected to the line portion CL2 can function as a gate electrode of the first transistor T1, a position of the line portion CL2 is not limited.

The plurality of first transistors T1 may be disposed in a region in which the line portion CL2, the plurality of first sub-data lines SDL1, and the plurality of second sub-data lines SDL2 are adjacent to one another. The plurality of first transistors T1 may include a first source electrode SE1, a first drain electrode DE1, a first gate electrode GE1, and a first active layer ACT1.

The first source electrode SE1 may extend from the first sub-data line SDL1 and may be disposed at an end of the first sub-data line SDL1. The first source electrode SE1 may be integrally formed with the first sub-data line SDL1.

The first drain electrode DE1 may extend from the second sub-data line SDL2 and may be disposed at an end of the second sub-data line SDL2. The first drain electrode DE1 may be integrally formed with the second sub-data line SDL2.

The first gate electrode GE1 may be a part of the line portion CL2. Alternatively, the first gate electrode GE1 may be a region extending from the line portion CL2. The first gate electrode GE1 may be integrally formed with the line portion CL2.

The first active layer ACT1 may overlap the first source electrode SE1, the first drain electrode DE1, and the first gate electrode GE1. The first active layer ACT1 may be formed in a cross shape to increase an area overlapping the first gate electrode GE1 and to be connected to the first source electrode SE1 and the first drain electrode DE1, but is not limited thereto.

The first transistor T1 may be turned on when the display panel PN is unfolded, and may be turned off when the display panel PN is folded. When the first transistor T1 is turned on, the data signal output from the data driver DD may be supplied from the first sub-data line SDL1 to the second sub-data line SDL2. Accordingly, both the first display area AA1 and the second display area AA2 may be driven to display an image. When the first transistor T1 is turned off, the data signal output from the data driver DD may be supplied only to the first sub-data line SDL1 and may not be supplied to the second sub-data line SDL2. Accordingly, since the first display area AA1 is driven to display an image, and the second display area AA2 is not driven, so that an image may not be displayed. That is, when the display panel PN is folded, the first transistor T1 is turned off, and the display area AA may be divisionally driven.

Referring to FIG. 4, the substrate 110 is a support member for supporting other components of the display device 100 and may be formed of an insulating material. For example, the substrate 110 may be formed of glass, resin or the like. Further, the substrate 110 may be formed of a polymer or plastic such as polyimide (PI), or may be formed of a material having flexibility.

The buffer layer 111 is disposed on the substrate 110. The buffer layer 111 may reduce penetration of moisture or impurities through the substrate 110. The buffer layer 111 may be formed of, for example, a single layer or multiple layers of silicon oxide (SiOx) or silicon nitride (SiNx), but is not limited thereto. However, the buffer layer 111 may be omitted depending on a type of the substrate 110 or types of the transistors T1 and T2, but is not limited thereto.

The second transistor T2 is disposed on the buffer layer 111. The second transistor T2 may be one of transistors included in the pixel circuit. For example, the second transistor T2 may be a driving transistor. The second transistor T2 is a thin film transistor having a top gate structure in which a gate electrode is disposed on an active layer. However, the present disclosure is not limited thereto, and the second transistor T2 may be implemented as a thin film transistor having a bottom gate structure.

The second transistor T2 includes a second active layer ACT2, a second gate electrode GE2, a second source electrode SE2, and a second drain electrode DE2.

The second active layer ACT2 is disposed on the buffer layer 111. The second active layer ACT2 may be formed of a semiconductor material such as an oxide semiconductor, amorphous silicon, or polysilicon, but is not limited thereto. For example, when the second active layer ACT2 is formed of an oxide semiconductor, the second active layer ACT2 includes a channel region, a source region, and a drain region, and the source region and the drain region may be conductive regions but are not limited thereto.

The gate insulating layer 112 is disposed on the second active layer ACT2. The gate insulating layer 112, an insulating layer for insulating the second active layer ACT2 and the second gate electrode GE2, may be configured of a single layer or multilayers of silicon oxide (SiOx) or silicon nitride (SiNx), but is not limited thereto.

The second gate electrode GE2 is disposed on the gate insulating layer 112. The second gate electrode GE2 may be formed of a conductive material, for example, copper (Cu), aluminum (Al), molybdenum (Mo), nickel (Ni), titanium (Ti), chromium (Cr), or an alloy thereof, but is not limited thereto.

The interlayer insulating layer 113 is disposed on the second gate electrode GE2. Contact holes for connecting each of the second source electrode SE2 and the second drain electrode SE2 to the second active layer ACT2 are formed in the interlayer insulating layer 113. The interlayer insulating layer 113 may be configured of a single layer or multiple layers of silicon oxide (SiOx) or silicon nitride (SiNx), but is not limited thereto.

The second source electrode SE2 and the second drain electrode DE2 are disposed on the interlayer insulating layer 113. The second source electrode SE2 and the second drain electrode DE2 may be spaced apart from each other and electrically connected to the second active layer ACT2. The second source electrode SE2 and the second drain electrode DE2 may be formed of a conductive material, for example, copper (Cu), aluminum (Al), molybdenum (Mo), nickel (Ni), titanium (Ti), chromium (Cr), or an alloy thereof, but is not limited thereto.

The passivation layer 114 is disposed on the second source electrode SE2 and the second drain electrode DE2. The passivation layer 114 is an insulating layer for protecting components under the passivation layer 114. For example, the passivation layer 114 may be configured of a single layer or multiple layers of silicon oxide (SiOx) or silicon nitride (SiNx), but is not limited thereto. In addition, the passivation layer 114 may be omitted depending on aspects.

The planarization layer 115 is disposed on the passivation layer 114. The planarization layer 115 is an insulating layer that flattens an upper portion of the substrate 110. The planarization layer 115 may be formed of an organic material, for example, may be configured of a single layer or multilayers of polyimide or photoacryl, but is not limited thereto.

The plurality of light emitting elements 130 are disposed in each of the plurality of sub-pixels SP on the planarization layer 115. The light emitting element 130 includes the anode 131, an organic layer 132, and a cathode 133.

The anode 131 is disposed on the planarization layer 115. The anode 131 may be electrically connected to the second transistor T2 and receive a driving current of the pixel circuit. Since the anode 131 supplies holes to the organic layer 132, it may be formed of a conductive material having a high work function. The anode 131 may be formed of, for example, a transparent conductive material such as indium tin oxide (ITO) or indium zinc oxide (IZO), but is not limited thereto.

Meanwhile, the display device 100 may be implemented in a top emission method or a bottom emission method. In the case of a top emission method, a metallic material having excellent reflection efficiency, for example, a reflective layer formed of a material such as aluminum (Al) or silver (Ag) may be added under the anode 131 so that light emitted from the organic layer 132 is reflected onto the anode 131 and directed upwardly, that is, toward the cathode 133. On the other hand, when the display device 100 is a bottom emission type, the anode 131 may be formed of only a transparent conductive material. Hereinafter, a description will be made on the assumption that the display device 100 according to an exemplary aspect is a top emission type, but the present disclosure is not limited thereto.

The bank 116 is disposed on the anode 131 and the planarization layer 115. The bank 116 is an insulating layer disposed between the plurality of sub-pixels SP to distinguish the plurality of sub-pixels SP. The bank 116 includes an opening exposing a portion of the anode 131. The bank 116 may be an organic insulating material disposed to cover an edge or an end portion of the anode 131. The bank 116 may be formed of, for example, polyimide, acrylic, or benzocyclobutene (BCB)-based resin, but is not limited thereto.

The organic layer 132 is disposed on the anode 131 and the bank 116. The organic layer 132 includes a light emitting layer and a common layer.

The light emitting layer is the organic layer 132 for emitting light of a specific color. Different light emitting layers may be disposed in each of the first sub-pixel SP1, the second sub-pixel SP2, and the third sub-pixel SP3, or the same light emitting layer may be disposed in all of the plurality of sub-pixels SP. For example, when different light emitting layers are disposed in each of the plurality of sub-pixels SP, a blue light emitting layer is disposed in the first sub-pixel SP1, a green light emitting layer is disposed in the second sub-pixel SP2, and a red light emitting layer may be disposed in the third sub-pixel SP3. Further, the light emitting layers of the plurality of sub-pixels SP may be connected to each other to form a single layer over the plurality of sub-pixels SP. For example, a light emitting layer is disposed on the entirety of the plurality of sub-pixels SP, and light from the light emitting layer may be converted into light of various colors through a separate light conversion layer, a color filter or the like.

In addition, a plurality of light emitting layers that emit light of the same color may be stacked in one sub-pixel SP. For example, two blue light emitting layers may be stacked in the first sub-pixel SP1, two green light emitting layers may be stacked in the second sub-pixel SP2, and two red light emitting layers may be disposed in the third sub-pixel SP3. In this case, a charge generation layer CGL is disposed between each of the plurality of light emitting layers, so that electrons or holes can be smoothly supplied to each of the plurality of light emitting layers. That is, a charge generation layer may be disposed between two blue light emitting layers, between two green light emitting layers, and between two red light emitting layers.

In addition, a plurality of light emitting layers that emit light of different colors may be stacked in one sub-pixel SP. For example, a blue light emitting layer and a yellow-green light emitting layer may be stacked in all of the plurality of sub-pixels SP, so that white light may be implemented in all of the plurality of sub-pixels SP. In this case, a charge generation layer may be disposed between the blue light emitting layer and the yellow-green light emitting layer.

The common layer is the organic layer 132 that is disposed to improve luminous efficiency of the light emitting layer. The common layer may be formed as a single layer over the plurality of sub-pixels SP. That is, the common layers of each of the plurality of sub-pixels SP may be connected to each other and formed integrally. The common layer may include the above-described charge generation layer, a hole injection layer, a hole transport layer, an electron transport layer, an electron injection layer, and the like, but is not limited thereto.

The cathode 133 is disposed on the organic layer 132. Since the cathode 133 supplies electrons to the organic layer 132, it may be formed of a conductive material having a low work function. The cathode 133 may be formed as a single layer over the plurality of sub-pixels SP. That is, the cathodes 133 of each of the plurality of sub-pixels SP may be connected to each other and formed integrally. The cathode 133 may be formed of, for example, a transparent conductive material such as indium tin oxide (ITO), indium zinc oxide (IZO), or an ytterbium (Yb) alloy, and may further include a metal-doped layer, but it is not limited thereto. Meanwhile, although not illustrated in the drawings, the cathode 133 may be electrically connected to the low potential power line disposed in a peripheral portion of the substrate 110 and receive a low potential power signal.

The first transistor T1 is disposed on the buffer layer 111. The first transistor T1 may be a transistor that is turned on or off by the control line CL. As described with reference to FIG. 3, the first transistor T1 may include the first active layer ACT1, the first gate electrode GE1, the first source electrode SE1, and the first drain electrode DE1.

The first active layer ACT1 is disposed on the buffer layer 111. The first active layer ACT1 may include the same material and may be formed by the same process, as the second active layer ACT2. The first active layer ACT1 may be formed of a semiconductor material such as an oxide semiconductor, amorphous silicon, or polysilicon, but is not limited thereto. For example, when the first active layer ACT1 is formed of an oxide semiconductor, it is configured of a channel region, a source region, and a drain region. The source region and the drain region may be conductive regions, but are not limited thereto.

The first gate electrode GE1 is disposed on the gate insulating layer 112. The first gate electrode GE1 includes the same material and may be formed by the same process, as the second gate electrode GE2. The first gate electrode GE1 may be a part of the line portion CL2 or a region extending from the line portion CL2. The first gate electrode GE1 may be formed of a conductive material, for example, copper (Cu), aluminum (Al), molybdenum (Mo), nickel (Ni), titanium (Ti), chromium (Cr), or an alloy thereof, but is not limited thereto.

The first source electrode SE1 and the first drain electrode DE1 are disposed on the interlayer insulating layer 113. The first source electrode SE1 and the first drain electrode DE1 may be connected to the first sub-data line SDL1 and the second sub-data line SDL2, respectively. The first source electrode SE1 and the first drain electrode DE1 include the same material as the second source electrode SE2 and the second drain electrode DE2 and may be formed by the same process as the second source electrode SE2 and the second drain electrode DE2. The first source electrode SE1 and the first drain electrode DE1 may be spaced apart from each other and electrically connected to the first active layer ACT1. The first source electrode SE1 and the first drain electrode DE1 may be formed of a conductive material, for example, copper (Cu), aluminum (Al), molybdenum (Mo), nickel (Ni), titanium (Ti), chromium (Cr), or an alloy thereof, but is not limited thereto.

Meanwhile, an auxiliary line 120 that connects the plurality of sub-pixels SP adjacent to each other is disposed in a partial region of the substrate 110. In particular, in a region of the auxiliary line 120 that overlaps the control line CL, lower lines 121 and 122 and an upper line 123 may be configured to be separated from each other.

The lower lines 121 and 122 are disposed on the buffer layer 111. The lower lines 121 and 122 include a first lower line 121 and a second lower line 122. The first lower line 121 and the second lower line 122 may be respectively connected to different sub-pixels SP. For example, the first lower line 121 may be connected to the first sub-pixel SP1 and the second lower line 122 may be connected to the second sub-pixel SP2 adjacent to the first sub-pixel SP1, but the present disclosure is not limited thereto. The first lower line 121 and the second lower line 122 may be separated from each other in a region overlapping the control line CL. That is, the first lower line 121 and the second lower line 122 may not overlap the control line CL. The first lower line 121 and the second lower line 122 may include the same material and be formed by the same process, as the active layers ACT1 and ACT2. For example, when the first lower line 121 and the second lower line 122 are formed of an oxide semiconductor, the first lower line 121 and the second lower line 122 may be conductive regions.

The upper line 123 is disposed on the interlayer insulating layer 113. The upper line 123 may electrically connect the first lower line 121 and the second lower line 122 through contact holes formed in the gate insulating layer 112 and the interlayer insulating layer 113. The upper line 123 may include the same material and may be formed by the same process, as the source electrodes SE1 and SE2 and the drain electrodes DE1 and DE2.

In the auxiliary line 120, the separated first lower line 121 and second lower line 122 may contact each other through the upper line 123. Accordingly, even if the auxiliary line 120 and the control line CL through which different signals are transmitted overlap each other, a signal transmission of the auxiliary line 120 may be easily performed without interference. If the auxiliary line 120 is formed of only the lower lines, a structure similar to a transistor may be formed in a region where the lower line and the control line CL overlap. Specifically, the active layers ACT1 and ACT2 may be conductive by using the gate electrodes GE1 and GE2 as a mask. Accordingly, a channel region may be formed in a region of the lower line that overlaps the control line CL, and a source region and a drain region may be formed on one side and the other side of the channel region, respectively. In this case, since a signal transmission of the lower line is not easily performed, it is not preferable. Thus, the auxiliary line 120 may include the first lower line 121 and the second lower line 122 that are separated in the region overlapping the control line CL, and the upper line 123 that connects the first lower line 121 and the second lower line 122. Thus, a signal that is transmitted through the auxiliary line 120 may be easily transferred between the plurality of sub-pixels SP.

Hereinafter, a detailed structure of the scan lines SL, the control line CL, and the folding detection line FSL in the non-display area NA will be described with reference to FIG. 5.

Figure 5:
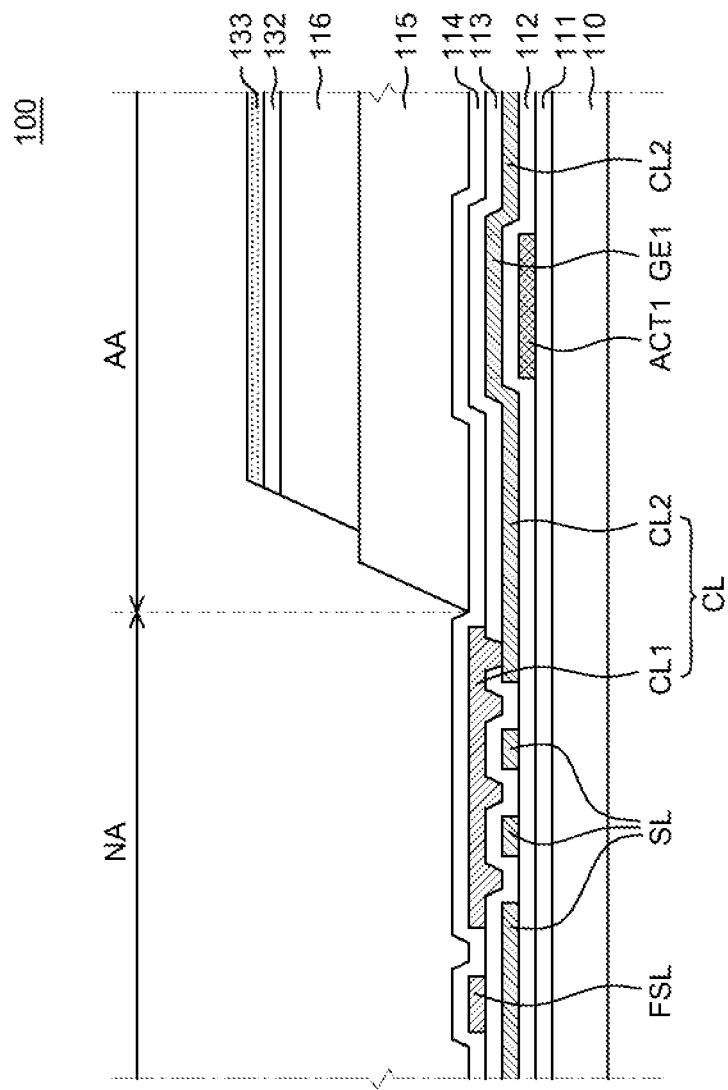
FIG. 5 is a cross-sectional view taken along line V-V' of FIG. 2.

FIG. 5 is a cross-sectional view taken along line V-V' of FIG. 2.

Referring to FIG. 5, the plurality of scan lines SL, the control line CL, and the folding detection line FSL are disposed in the non-display area NA of the substrate 110.

The plurality of scan lines SL are disposed on the gate insulating layer 112 in the non-display area NA. The plurality of scan lines SL may extend from the gate driver GD to each of the plurality of sub-pixels SP. The plurality of scan lines SL may include the same material and may be formed by the same process as the gate electrodes GE1 and GE2 of the transistors T1 and T2. The scan line SL may be formed of a conductive material, for example, copper (Cu), aluminum (Al), molybdenum (Mo), nickel (Ni), titanium (Ti), chromium (Cr), or an alloy thereof, but is not limited thereto.

The control line CL extends from the non-display area NA to the display area AA. The control line CL includes the connection portion CL1 and the line portion CL2.

The connection portion CL1 is disposed on the interlayer insulating layer 113 in the non-display area NA. The connection portion CL1 may extend along a perimeter of the display area AA from the data driver DD. The connection portion CL1 may be connected to one end of the line portion CL2 through a contact hole formed in the interlayer insulating layer 113. Further, although not shown, at the other end of the line portion CL2, another connection portion CL1 and the line portion CL2 may be connected to each other through a contact hole formed in the interlayer insulating layer 113. The connection portion CL1 may include the same material and may be formed by the same process, as the source electrodes SE1 and SE2 and the drain electrodes DE1 and DE2 of the transistors T1 and T2. The connection portion CL1 may be formed of a conductive material, for example, copper (Cu), aluminum (Al), molybdenum (Mo), nickel (Ni), titanium (Ti), chromium (Cr), or an alloy thereof, but is not limited thereto.

The line portion CL2 is disposed on the gate insulating layer 112. One end and the other end of the line portion CL2 may be connected to the connection portion CL1 in the non-display area NA. Also, the line portion CL2 may extend from the connection portion CL1 to cross the display area AA. A part of the line portion CL2 that overlaps the first active region ACT1 may function as the first gate electrode GE1 of the first transistor T1. The line portion CL2 may be formed of the same material on the same layer as the plurality of scan lines SL.

The folding detection line FSL is disposed on the interlayer insulating layer 113 in the non-display area NA. The folding detection line FSL may extend along the perimeter of the display area AA from the data driver DD. The folding detection line FSL may be disposed outside the control line CL, but is not limited thereto. The folding detection line FSL may be formed of the same material on the same layer as the connection portion CL1.

In general, when the display device is divisionally driven, a scan signal of the gate driver is controlled so that only a portion of the display area is driven. That is, during divisional driving, the scan signal is supplied only to scan lines in the driving area, and is not supplied to scan lines in the non-driving area. However, even if the scan signal is not supplied to the non-driving area, a data signal by the data line is supplied not only to the driving area but also to the non-driving area. Specifically, the data line extends to be connected to all of the plurality of sub-pixels disposed in the same column. Accordingly, during divisional driving, a data signal is applied to all of the plurality of sub-pixels that are disposed in the driving area and the non-driving area within the same column. In this case, since the data signal is fully charged even in the non-driving area, data charging time may be insufficient when a load increases. In addition, there is a difficulty in reducing power consumption when the display device has a large area or is driven at a high speed.

In the display device 100 according to an exemplary aspect of the present disclosure, since the data line DL is separated between the first display area AA1 and the second display area AA2, the data signal may be supplied only to the driving area. Specifically, the data line DL may be divided into the first sub-data line SDL1 that corresponds to the first display area AA1 and the second sub-data line SDL2 that corresponds to the second display area AA2. In addition, the transistor T1 may be disposed between the first sub-data line SDL1 and the second sub-data line SDL2. Accordingly, when the first transistor T1 is turned on, the first sub-data line SDL1 and the second sub-data line SDL2 are electrically connected to each other, and when the first transistor T1 is turned off, the first sub-data line SDL1 and the second sub-data line SDL2 may be electrically insulated from each other. Thus, when the data driver DD outputs a data signal, the data signal may be applied all the time to the first sub-data line SDL1 that is directly electrically connected to the data driver DD. That is, the first display area AA1 may be driven all the time. On the other hand, a data signal may be selectively applied to the second sub-data line SDL2 that is electrically connected to or insulated from the first sub-data line SDL1 by the transistor T1. That is, the second display area AA2 may be selectively driven. Thus, during divisional driving, the data signal is applied only to the constant driving area, so that a data load may be reduced. Accordingly, the display device 100 according to an exemplary aspect may secure data charging time and reduce power consumption.

The display device 100 according to an exemplary aspect of the present disclosure includes the control line CL for controlling the first transistor T1. The first transistor T1 may be turned on or off by a control signal of the control line CL. In this case, the control signal may be changed depending on whether or not folding is detected by the folding detection line FSL. Specifically, when folding is detected by the folding detection line FSL, a control signal for turning off the first transistor T1 may be applied to the control line CL. In addition, when folding is not detected by the folding detection line FSL, a control signal for turning on the first transistor T1 may be applied to the control line CL. That is, full driving and divisional driving may be easily performed depending on whether or not the display device 100 is folded.

The first transistor T1 may be formed by the same process as the second transistor T2 for driving the plurality of sub-pixels SP. Specifically, the active layer ACT1 of the first transistor T1 may be formed to include the same material on the same layer as the active layer ACT2 of the second transistor T2. The gate electrode GE1 of the first transistor T1 may be formed to include the same material on the same layer as the gate electrode GE2 of the second transistor T2. The source electrode SE1 and the drain electrode DE1 of the first transistor T1 may be formed to include the same material on the same layer as the source electrode SE2 and the drain electrode DE2 of the second transistor T2. That is, the first transistor T1 may be formed without a separate additional process. Thus, there is an effect of reducing power consumption when divisional driving of the display device 100 is performed without additional costs.

In the display device 100 according to an exemplary aspect of the present disclosure, the connection portion CL1 and the line portion CL2 of the control line CL may be disposed on different layers. Specifically, the line portion CL2 may be disposed on the same layer as the plurality of scan lines SL. The connection portion CL1 may be disposed in the non-display area NA in which the plurality of scan lines SL are disposed. In this case, the connection portion CL1 may be disposed on the same layer as the source electrodes SE1 and SE2 and the drain electrodes DE1 and DE2 of the transistors T1 and T2. That is, the connection portion CL1 that overlaps the plurality of scan lines SL may be disposed on a layer different from that of the line portion CL2. Thus, the control line CL may be easily formed without being affected by positions of the plurality of scan lines SL.

Also, the folding detection line FSL may be disposed on the non-display area NA in which the plurality of scan lines SL are disposed, similar to the connection portion CL1. In this case, the folding detection line FSL together with the connection portion CL1 may be disposed on the same layer as the source electrodes SE1 and SE2 and the drain electrodes DE1 and DE2 of the transistors T1 and T2. Thus, the folding detection line FSL may also be easily formed without being affected by the positions of the plurality of scan lines SL.

In addition, the auxiliary line 120 that connects the plurality of sub-pixels SP may be configured to be in contact through the plurality of lines in a region overlapping the control line CL. That is, the first lower line 121 and the second lower line 122 respectively connected to different sub-pixels SP may be connected by the upper line 123. In this case, the first lower line 121 and the second lower line 122 may be formed of the same material on the same layer as the active layers ACT1 and ACT2 of the transistors T1 and T2. In addition, the first lower line 121 and the second lower line 122 are separated in the region overlapping the control line CL and do not overlap the control line CL. Thus, formation of the transistor between the lower lines 121 and 122 and the control line CL may be prevented, and a signal transmission of the auxiliary line 120 may be easily performed.

Figure 6:
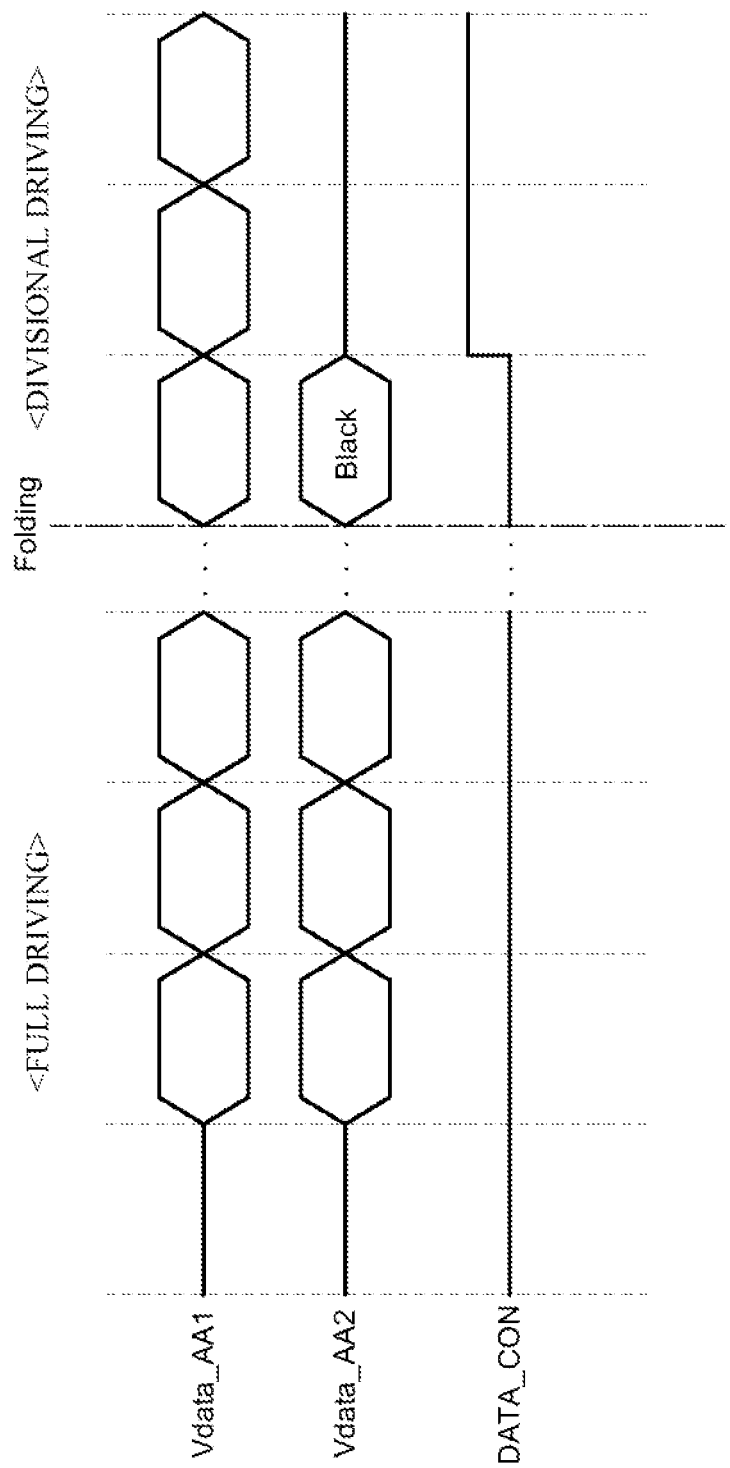
FIG. 6 is a schematic timing diagram illustrating a method of driving the display device according to an exemplary aspect of the present disclosure.

FIG. 6 is a schematic timing diagram illustrating a method of driving the display device according to an exemplary aspect of the present disclosure. In FIG. 6, only data signals Vdata_AA1 and Vdata_AA2 and control signals DATA_CON input through the data driver DD are illustrated for convenience of description.

Referring to FIG. 6, the data driver DD inputs a first data signal Vdata_AA1 to the plurality of first sub-data lines SDL1 of the first display area AA1 and inputs a second data signal Vdata_AA2 to the plurality of second sub-data lines SDL2 of the second display area AA2. Also, the data driver DD inputs the control signal DATA_CON to the control line CL.

A full driving period is a period in which the display device 100 is unfolded. At this time, a change in resistance equal to or greater than a preset value may not occur in the folding detection line FSL, and the folding detection sensor determines that the display device 100 is in an unfolded state. Thus, the data driver DD may output a control signal for turning on the first transistor T1 to the control line CL.

A divisional driving period is a period in which the display device 100 is folded. In this case, a change in resistance equal to or greater than a preset value may occur in the folding detection line FSL. Accordingly, the folding detection sensor determines that the display device 100 is in a folding state and outputs a folding detection signal. Thus, the data driver DD may output a control signal for turning off the first transistor T1 to the control line CL.

Meanwhile, when a low voltage is applied to the control line CL, the first transistor T1 may be turned on, and when a high voltage is applied to the control line CL, the first transistor may be turned off. That is, the first transistor T1 is implemented as a P-channel metal oxide semiconductor (PMOS) and may be turned on or off according to the change in voltage as described above. However, the present disclosure is not limited thereto, and the first transistor T1 is implemented as an N-channel metal oxide semiconductor (NMOS) and may be turned off when a low voltage is applied, and may be turned on when a high voltage is applied.

In the full driving period, the data driver DD may apply a low voltage to the control line CL. Accordingly, the first transistor T1 is turned on so that the plurality of first sub-data lines SDL1 and the plurality of second sub-data lines SDL2 may be electrically connected. The data driver DD may input the data signals Vdata_AA1 and Vdata_AA2 to both the first display area AA1 and the second display area AA2. Accordingly, in the full driving period, all of the plurality of sub-pixels SP of the display area AA emit light, and an image may be displayed over the entirety of the display area AA. That is, when the display device 100 is not folded, the display device 100 may be driven entirely.

If the folding detection sensor recognizes folding through the folding detection line FSL, the folding detection sensor may output a folding detection signal. When the folding detection signal is input, the data driver DD may output a signal for divisionally driving the display device 100.

Specifically, in the divisional driving period, the data driver DD may input a black signal, which is an initial signal, to the second display area AA2. In this case, a low voltage is still applied to the control line CL, and the first transistor T1 may be in a turned-on state. Thus, the black signal may be input to the plurality of second sub-data lines SDL2, and the second display area AA2 may be initialized. After initialization of the second display area AA2, the data driver DD may apply a high voltage to the control line CL. Accordingly, the first transistor T1 is turned off so that the plurality of first sub-data lines SDL1 and the plurality of second sub-data lines SDL2 may be electrically insulated from each other. The data driver DD may input the data signal Vdata_AA1 only to the first display area AA1 and block the data signal in the second display area AA2. Therefore, in the divisional driving period, only the plurality of sub-pixels SP of the first display area AA1 emit light, and an image may be displayed only in a portion of the display area AA. That is, when the display device 100 is folded, the display device 100 may be divisionally driven.

Table 1 shows resistance of the data line and data settling time in full driving and divisional driving of the display device 100 according to an aspect of the present disclosure.

TABLE 1

| | Data Line Resistance (kΩ) | Data Settling Time (μs) |
|---|---|---|
| Full Driving | 3.45 | 3.2 |
| Divisional Driving | 1.73 | 2.06 |

Referring to Table 1, it can be confirmed that a length of the data line DL decreases in divisional driving, compared to full driving, so that the resistance of the data line DL decreases. In addition, it can be confirmed that settling time of the data signal is also reduced as the resistance of the data line DL decreases.

That is, in the display device 100 according to an exemplary aspect of the present disclosure, the plurality of data lines DL are configured to be separated into the first sub-data lines SDL1 and the second sub-data lines SDL2 in the constant driving area and the selective driving area. In this case, the first transistor T1 that is turned on or off depending on whether or not the display device 100 is folded may be disposed between the first sub-data line SDL1 and the second sub-data line SDL2. Accordingly, since the data signal is supplied all the time only to the driving area in the case of folding, power consumption can be reduced. In addition, since the resistance of the data line and a data load is reduced, the settling time of the data signal can be reduced.

Figure 7A:
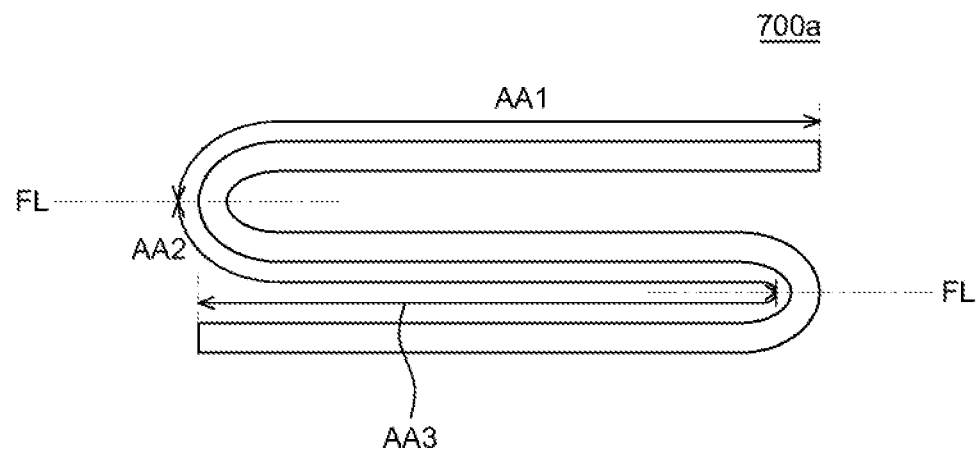
FIG. 7A and FIG. 7B are cross-sectional views illustrating folding structures of display devices according to various aspects of the present disclosure.
Figure 7B:
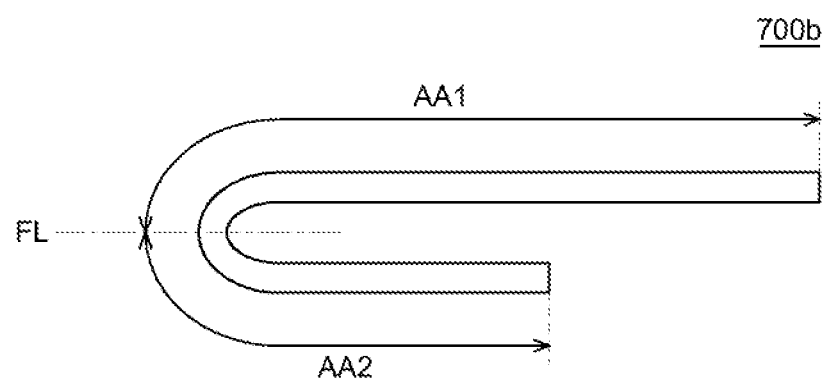

FIG. 7A and FIG. 7B are cross-sectional views illustrating folding structures of display devices according to various aspects of the present disclosure. A structure and driving method of the display device 100 described in FIGS. 3 to 6 may be equally applied to display devices 700a and 700b of FIGS. 7A and 7B.

Referring to FIG. 7A, the display device 700a according to another exemplary aspect of the present disclosure may be implemented in a multi-folding method. That is, the display device 700a may include at least two folding lines FL. In this case, the display area AA may be divided into a first display area AA1 that is a constant driving area, and a second display area AA2 and a third display area AA3 that are selective driving areas, but are limited thereto.

Referring to FIG. 7B, in the display device 700b according to another exemplary aspect of the present disclosure, the first display area AA1 and the second display area AA2 may have different areas. Specifically, the first display area AA1 may be formed to have a larger area than that of the second display area AA2. Also, the folding line FL of the display device 700b may be disposed closer to an end of the second display area AA2 than an end of the first display area AA1. In this case, the first display area AA1 may be a constant driving area, and the second display area AA2 may be a selective driving area, but the present disclosure is not limited thereto.

The exemplary aspects of the present disclosure can also be described as follows:

According to an aspect of the present disclosure, a display device may include a substrate including a display area having a first display area and a second display area, and a non-display area extending from the display area; a plurality of first sub-data lines disposed in the first display area; a plurality of second sub-data lines disposed in the second display area to correspond to the plurality of first sub-data lines; a control line including a line portion extending in a direction different from a direction in which the plurality of first sub-data lines and the plurality of second sub-data lines extend; and a plurality of transistors disposed between the plurality of first sub-data lines and the plurality of second sub-data lines and controlled by the control line to connect or disconnect the plurality of first sub-data lines and the plurality of second sub-data lines.

The plurality of first sub-data lines and the plurality of second sub-data lines may be spaced apart from each other.

The plurality of transistors may include a gate electrode that is a part of the line portion or that is connected to the line portion; an active layer overlapping the gate electrode; a source electrode connected to the plurality of first sub-data lines; and a drain electrode connected to the plurality of second sub-data lines.

When the plurality of transistors are turned on, the plurality of first sub-data lines and the plurality of second sub-data lines may be electrically connected to each other, and when the plurality of transistors are turned off, the plurality of first sub-data lines and the plurality of second sub-data lines may be electrically insulated from each other.

The display device may further include a folding detection line disposed on the non-display area to surround the display area. When folding is detected by the folding detection line, the plurality of transistors may be turned off.

The display device may further include a data driver electrically connected to the plurality of first sub-data lines. When the plurality of transistors are turned off, the data driver may be electrically insulated from the plurality of second sub-data lines.

The first display area may be disposed closer to the data driver compared to the second display area.

The control line may be disposed along a perimeter of the first display area.

The control line may include the line portion disposed to cross the display area; and a connection portion disposed in the non-display area and extending in the same direction as the plurality of first sub-data lines and the plurality of second sub-data lines from each of one end and the other end of the line portion.

The folding detection line and the connection portion may be disposed on a same layer.

The display device may further include a plurality of scan lines extending in the same direction as the line portion. The plurality of scan lines may be disposed on the same layer as the line portion and spaced apart from the line portion.

The line portion and the connection portion may be disposed on different layers.

The transistors may be formed by a same process as driving transistors for driving a plurality of sub-pixels disposed in the display area.

The transistors may be turned on when the display device is unfolded, and may be turned off when the display device is folded.

The display device may further comprise an auxiliary line configured to connect a plurality of sub-pixels adjacent to each other disposed in a partial region of the substrate. In a region of the auxiliary line that overlaps the control line, the auxiliary line may include a first lower line and a second lower line connected to sub-pixels adjacent to each other, and an upper line connecting the first lower line and the second lower line. The first lower line and the second lower line may not overlap the control line.

According to another aspect of the present disclosure, a display device includes a substrate including a display area divided into a constant driving area and a selective driving area by a virtual folding line in which folding is performed; a control line including a line portion extending in parallel with the folding line; a plurality of data lines extending in a direction that crosses the folding line and separated between the constant driving area and the selective driving area; and a plurality of transistors disposed between the plurality of separated data lines and turned on or off by the control line. When the plurality of transistors are turned on, the plurality of separated data lines are electrically connected so that the selective driving area is switched to a driving state. When the plurality of transistors are turned off, the plurality of separated data lines are electrically insulated so that the selective driving area is switched to a non-driving state.

The display device may further include a folding detection line disposed outside the display area to surround the display area. When folding is detected by the folding detection line, the plurality of transistors may be turned off. When unfolding is detected by the folding detection line, the plurality of transistors may be turned on.

The plurality of data lines may include a first sub-data line disposed in the constant driving area and a second sub-data line disposed in the selective driving area and corresponding to the first sub-data line.

The plurality of transistors may include a gate electrode that is a part of the line portion or that is connected to the line portion; an active layer overlapping the gate electrode; a source electrode connected to the first sub-data line; and a drain electrode connected to the second sub-data line.

The control line may include the line portion disposed to cross the display area; and a connection portion disposed outside the display area and extending in a direction parallel to the plurality of data lines from each of one end and the other end of the line portion.

The folding detection line and the connection portion may be disposed on a same layer.

The line portion and the connection portion may be disposed on different layers.

The display device may further include a data driver connected to the plurality of data lines. The constant driving area may be disposed adjacent to the data driver compared to the selective driving area.

The transistors may be formed by a same process as driving transistors for driving a plurality of sub-pixels disposed in the display area.

The display device may further comprise a plurality of scan lines extending in the same direction as the line portion. The plurality of scan lines may be disposed on the same layer as the line portion and spaced apart from the line portion.

The transistors may be turned on when the display device is unfolded and may be turned off when the display device is folded.

The display device may further comprise an auxiliary line configured to connect a plurality of sub-pixels adjacent to each other disposed in a partial region of the substrate. In a region of the auxiliary line that overlaps the control line, in a region of the auxiliary line that overlaps the control line, the auxiliary line may include a first lower line and a second lower line connected to sub-pixels adjacent to each other, and an upper line connecting the first lower line and the second lower line. The first lower line and the second lower line may not overlap the control line.

Although the exemplary aspects of the present disclosure have been described in detail with reference to the accompanying drawings, the present disclosure is not limited thereto and may be embodied in many different forms without departing from the technical concept of the present disclosure. Therefore, the exemplary aspects of the present disclosure are provided for illustrative purposes only but not intended to limit the technical concept of the present disclosure. The scope of the technical concept of the present disclosure is not limited thereto. Therefore, it should be understood that the above-described exemplary aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:
   a substrate including a display area having a first display area and a second display area and a non-display area extending from the display area;
   a plurality of first sub-data lines disposed in the first display area;
   a data driver electrically connected to the plurality of first sub-data lines;
   a plurality of second sub-data lines disposed in the second display area to correspond to the plurality of first sub-data lines;
   a control line including a line portion extending in a direction different from a direction in which the plurality of first sub-data lines and the plurality of second sub-data lines extend and a connection portion vertically extended from the line portion to the data driver; and
   a plurality of transistors disposed between the plurality of first sub-data lines and the plurality of second sub-data lines and controlled by the control line to connect or disconnect the plurality of first sub-data lines and the plurality of second sub-data lines.

2. The display device of claim 1, wherein the plurality of first sub-data lines and the plurality of second sub-data lines are spaced apart from each other.

3. The display device of claim 1, wherein the plurality of transistors include:
   a gate electrode that is a part of the line portion or that is connected to the line portion;
   an active layer overlapping with the gate electrode;
   a source electrode connected to the plurality of first sub-data lines; and
   a drain electrode connected to the plurality of second sub-data lines.

4. The display device of claim 1, wherein the plurality of first sub-data lines and the plurality of second sub-data lines are electrically connected to each other when the plurality of transistors are turned on, and
   wherein the plurality of first sub-data lines and the plurality of second sub-data lines are electrically insulated from each other when the plurality of transistors are turned off.

5. The display device of claim 1, further comprising a folding detection line disposed on the non-display area to surround the display area,
   wherein the plurality of transistors are turned off when folding is detected by the folding detection line.

6. The display device of claim 1,
   wherein the data driver is electrically insulated from the plurality of second sub-data lines when the plurality of transistors are turned off.

7. The display device of claim 6, wherein the first display area is disposed to the data driver closer than the second display area.

8. The display device of claim 1, wherein the control line is disposed along a perimeter of the first display area.

9. The display device of claim 8, wherein the connection portion is disposed in the non-display area and extending in a same direction as the plurality of first sub-data lines and the plurality of second sub-data lines from each of one end and the other end of the line portion and the line portion disposed to cross the display area.

10. The display device of claim 9, further comprising:
    a plurality of scan lines extending in a same direction as the line portion,
    wherein the plurality of scan lines are disposed on the same layer as the line portion and spaced apart from the line portion.

11. The display device of claim 9, wherein the line portion and the connection portion are disposed on different layers.

12. The display device of claim 1, wherein the transistors are formed by a same process as driving transistors for driving a plurality of sub-pixels disposed in the display area.

13. The display device of claim 1, further comprising an auxiliary line configured to connect a plurality of sub-pixels adjacent to each other disposed in a partial region of the substrate,
    wherein in a region of the auxiliary line that overlaps with the control line, the auxiliary line includes a first lower line and a second lower line connected to sub-pixels adjacent to each other, and an upper line connecting the first lower line and the second lower line, and
    wherein the first lower line and the second lower line do not overlap the control line.

14. A display device, comprising:
    a substrate including a display area divided into a constant driving area and a selective driving area by a virtual folding line in which folding is performed;
    a plurality of data lines extended in a direction that crosses the virtual folding line and separated between the constant driving area and the selective driving area;
    a data driver connected to the plurality of data lines;
    a control line including a line portion extended in parallel with the folding line and a connection portion vertically extended from the line portion to the data driver; and
    a plurality of transistors disposed between the plurality of separated data lines and turned on or off by the control line,
    wherein when the plurality of transistors are turned on, the plurality of separated data lines are electrically connected so that the selective driving area is switched to a driving state, and
    wherein when the plurality of transistors are turned off, the plurality of separated data lines are electrically insulated so that the selective driving area is switched to a non-driving state.

15. The display device of claim 14, further comprising a folding detection line disposed outside the display area to surround the display area,
    wherein the plurality of transistors are turned off when folding is detected by the folding detection line, and
    wherein the plurality of transistors are turned on when unfolding is detected by the folding detection line.

16. The display device of claim 14, wherein the plurality of data lines include a first sub-data line disposed in the constant driving area and a second sub-data line disposed in the selective driving area and corresponding to the first sub-data line.

17. The display device of claim 16, wherein the plurality of transistors include:

a gate electrode that is a part of the line portion or that is connected to the line portion;

an active layer overlapping the gate electrode;

a source electrode connected to the first sub-data line; and a drain electrode connected to the second sub-data line.

18. The display device of claim 14, wherein the connection portion is disposed outside the display area and extending in a direction parallel to the plurality of data lines from each of one end and the other end of the line portion, and the line portion disposed to cross the display area.

19. The display device of claim 18, wherein the line portion and the connection portion are disposed on different layers.

20. The display device of claim 18, further comprising a plurality of scan lines extending in the same direction as the line portion, wherein the plurality of scan lines are disposed on the same layer as the line portion and spaced apart from the line portion.

21. The display device of claim 14, wherein the constant driving area is disposed adjacent to the data driver compared to the selective driving area.

22. The display device of claim 14, wherein the transistors are formed by a same process as driving transistors for driving a plurality of sub-pixels disposed in the display area.

23. The display device of claim 14, further comprising an auxiliary line configured to connect a plurality of sub-pixels adjacent to each other disposed in a partial region of the substrate, wherein in a region of the auxiliary line that overlaps the control line, the auxiliary line includes a first lower line and a second lower line connected to sub-pixels adjacent to each other, and an upper line connecting the first lower line and the second lower line, and wherein the first lower line and the second lower line do not overlap the control line.

* * * * *